(12) United States Patent
Cai

(10) Patent No.: US 7,977,715 B2
(45) Date of Patent: Jul. 12, 2011

(54) LDMOS DEVICES WITH IMPROVED ARCHITECTURES

(75) Inventor: Jun Cai, Scarborough, ME (US)

(73) Assignee: Fairchild Semiconductor Corporation, San Jose, CA (US)

(*) Notice: Subject to any disclaimer, the term of this patent is extended or adjusted under 35 U.S.C. 154(b) by 184 days.

(21) Appl. No.: 12/049,788

(22) Filed: Mar. 17, 2008

(65) Prior Publication Data

US 2009/0230468 A1 Sep. 17, 2009

(51) Int. Cl.
*H01L 27/088* (2006.01)
*H01L 29/78* (2006.01)
*H01L 21/8234* (2006.01)
*H01L 21/336* (2006.01)

(52) U.S. Cl. . 257/288; 257/337; 257/343; 257/E29.256; 257/E27.06; 257/E21.616; 257/E21.417; 438/276; 438/307

(58) Field of Classification Search .................... 257/288
See application file for complete search history.

(56) References Cited

U.S. PATENT DOCUMENTS

| 5,348,895 | A | * | 9/1994 | Smayling et al. | 438/234 |
| 5,583,365 | A | | 12/1996 | Villa et al. | |
| 5,589,409 | A | * | 12/1996 | Bulucea et al. | 438/377 |
| 6,979,875 | B2 | | 12/2005 | Kwon et al. | |
| 2002/0109184 | A1 | * | 8/2002 | Hower et al. | 257/335 |
| 2004/0033666 | A1 | * | 2/2004 | Williams et al. | 438/297 |
| 2004/0259318 | A1 | * | 12/2004 | Williams et al. | 438/400 |
| 2005/0253216 | A1 | | 11/2005 | Tsuchiko | |
| 2006/0057784 | A1 | * | 3/2006 | Cai et al. | 438/149 |
| 2007/0212823 | A1 | * | 9/2007 | Ren et al. | 438/142 |

OTHER PUBLICATIONS

International Search Report and Written Opinion of Corresponding PCT Application No. PCT/US2009/036632 completed Oct. 16, 2009 by the ISA (KR), total 7 pages.

* cited by examiner

*Primary Examiner* — Jarrett J Stark
*Assistant Examiner* — Lawrence Tynes, Jr.
(74) *Attorney, Agent, or Firm* — Hiscock & Barclay, LLP

(57) ABSTRACT

An LDMOS device includes a substrate of a first conductivity type, an epitaxial layer on the substrate, a buried well of a second conductivity type opposite to the first conductivity type in a lower portion of the epitaxial layer, the epitaxial layer being of the first conductivity type below the buried layer. The device further includes a field oxide located between a drain and both a gate on a gate oxide and a source with a saddle shaped vertical doping gradient of the second conductivity type in the epitaxial layer above the buried well such that the dopant concentration in the epitaxial layer above the buried well and below a central portion of the field oxide is lower than the dopant concentration at the edges of the field oxide nearest the drain and nearest the gate.

57 Claims, 15 Drawing Sheets

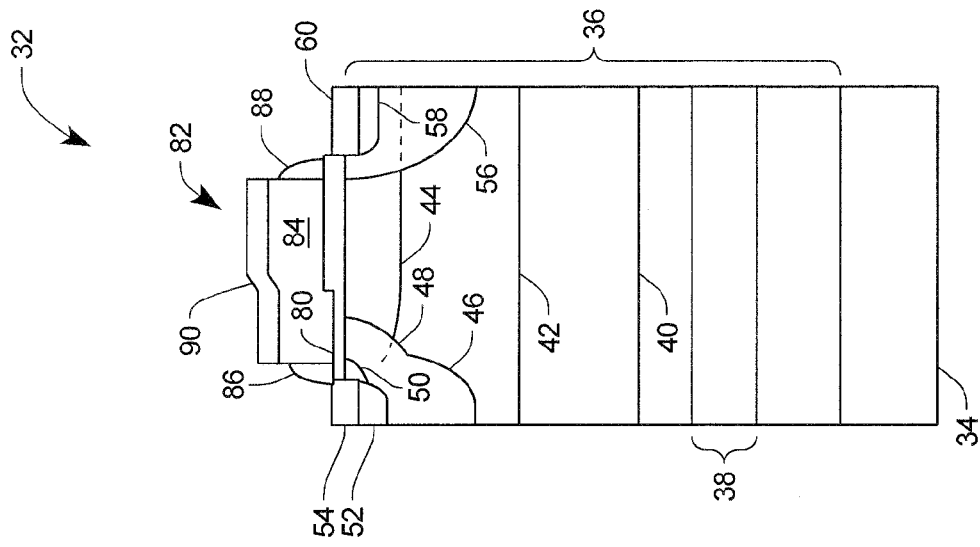
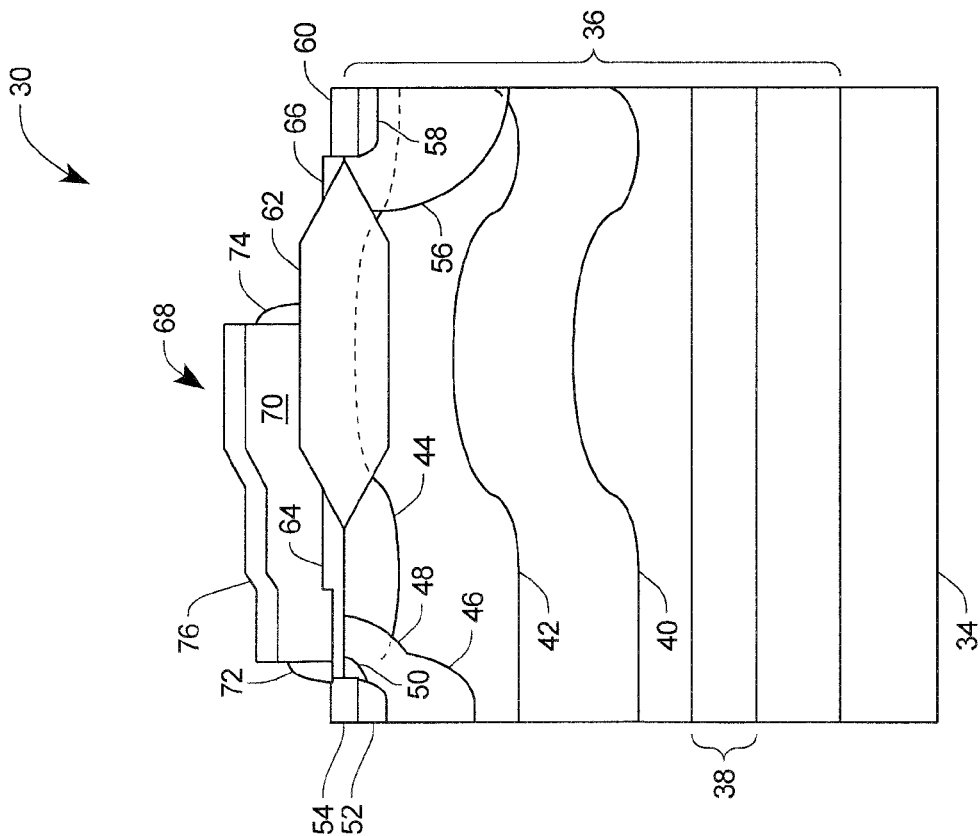
FIG. 1B
FIG. 1A

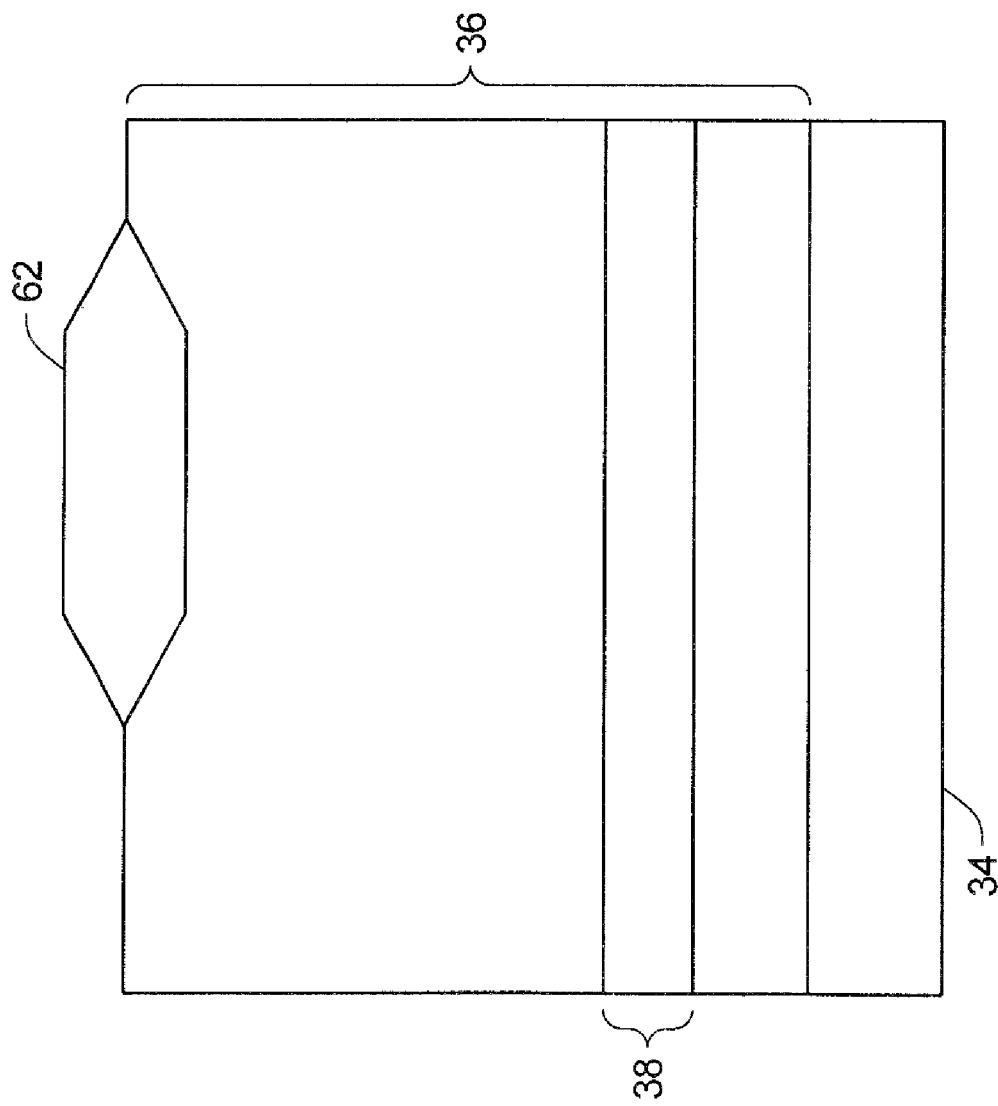

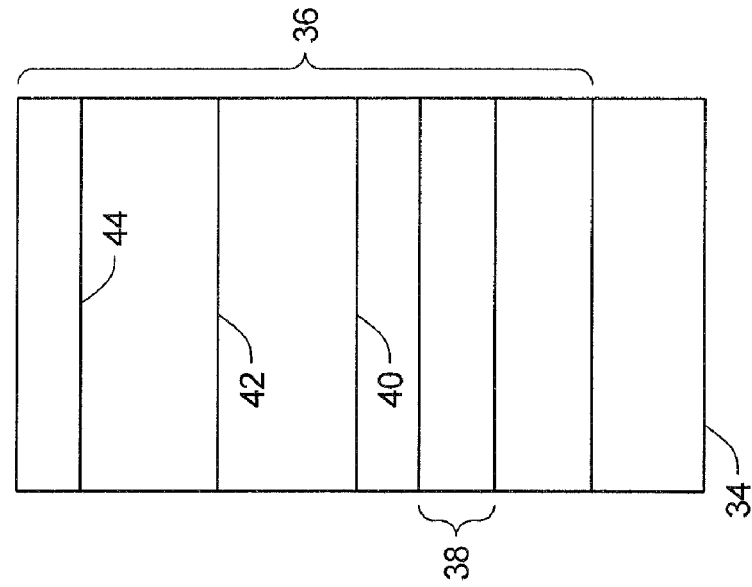
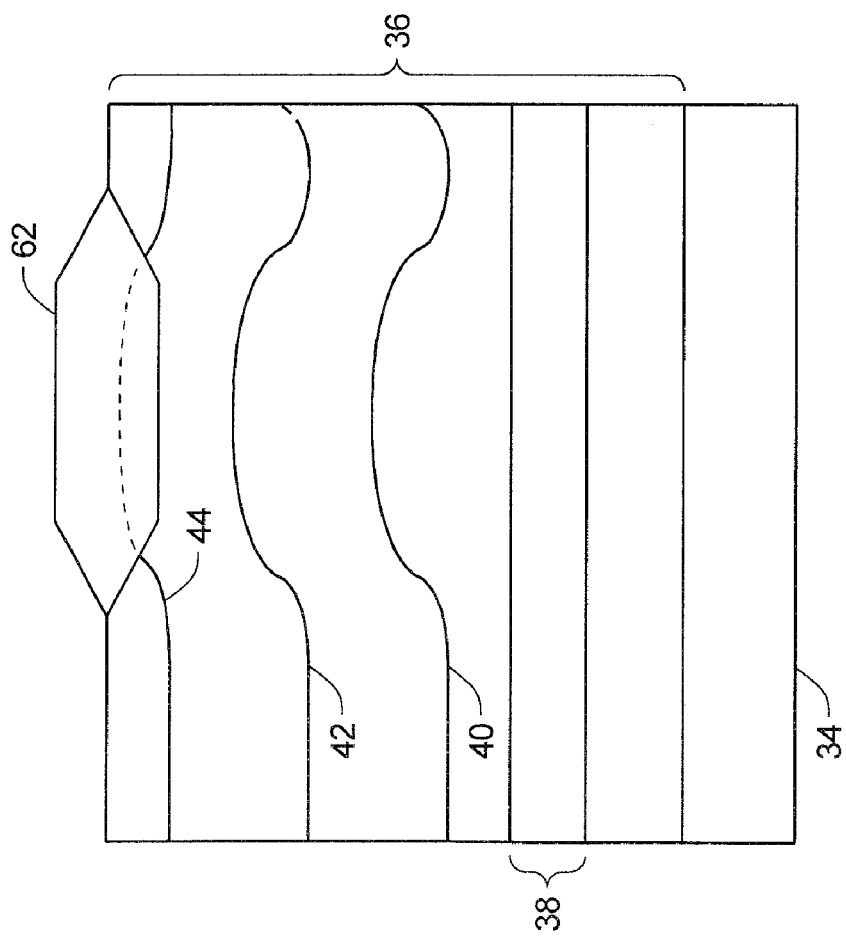

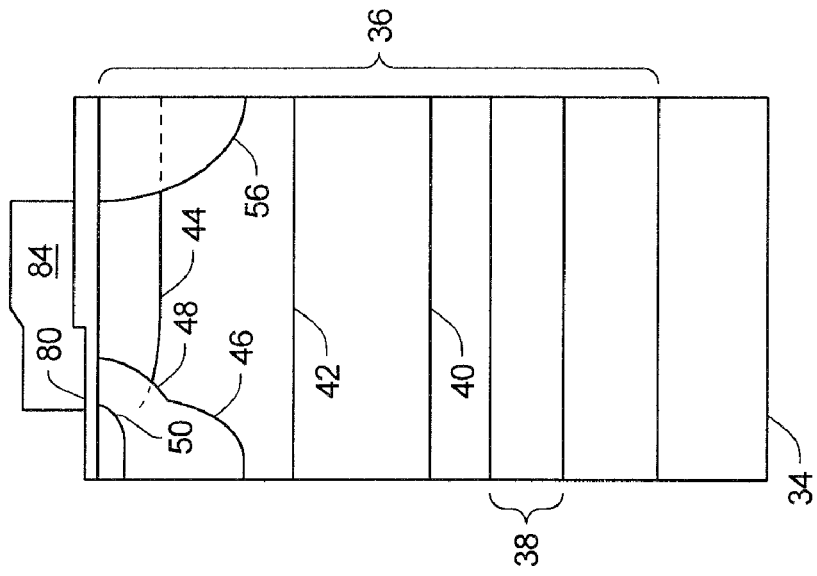
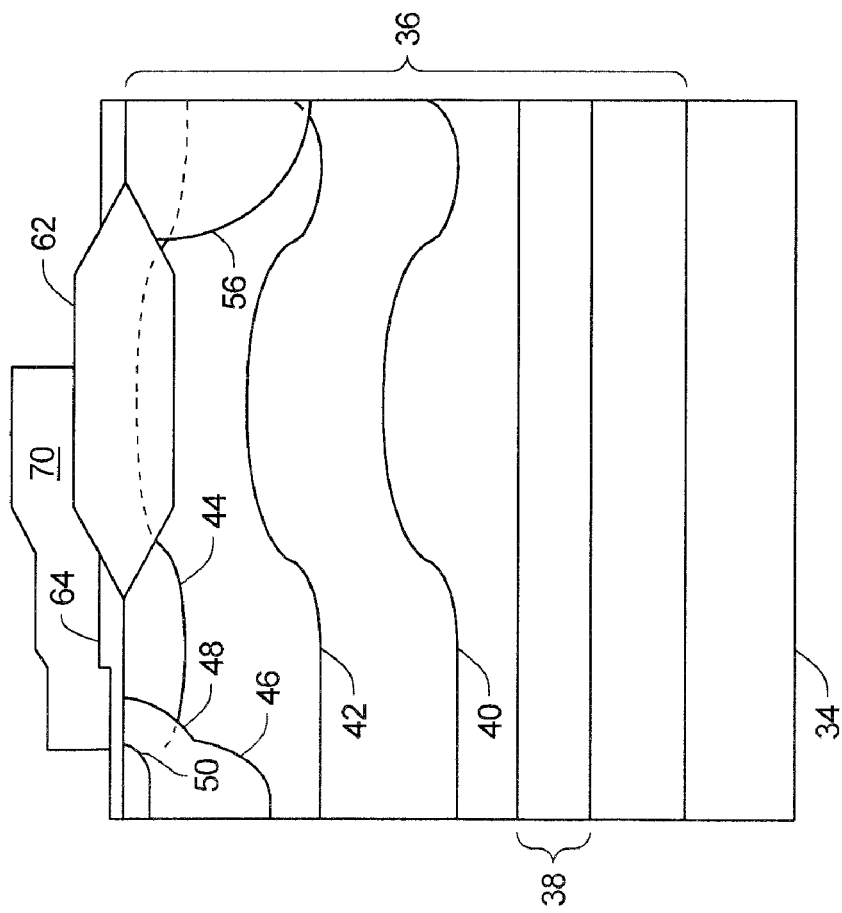
FIG. 8B
FIG. 8A

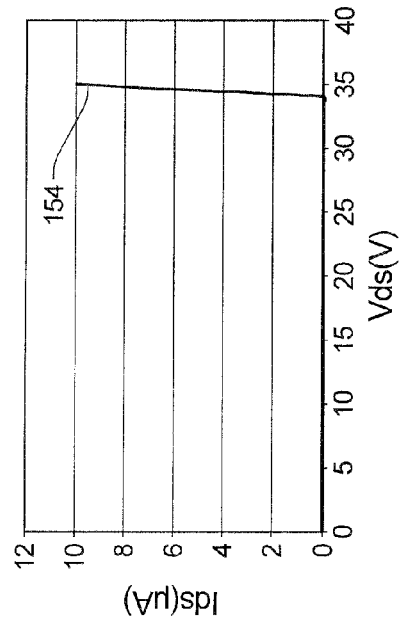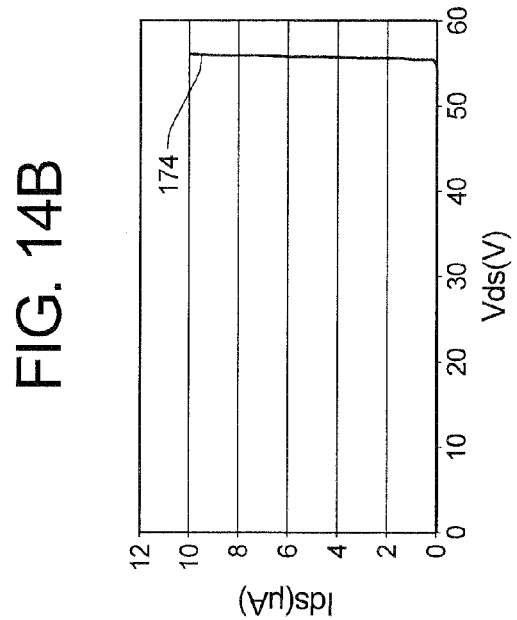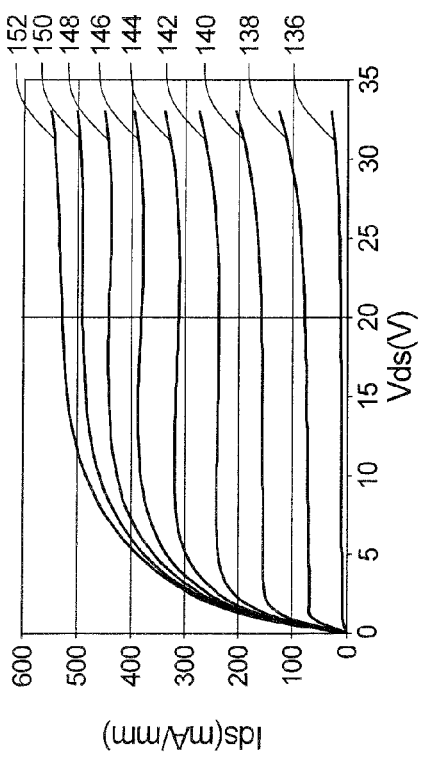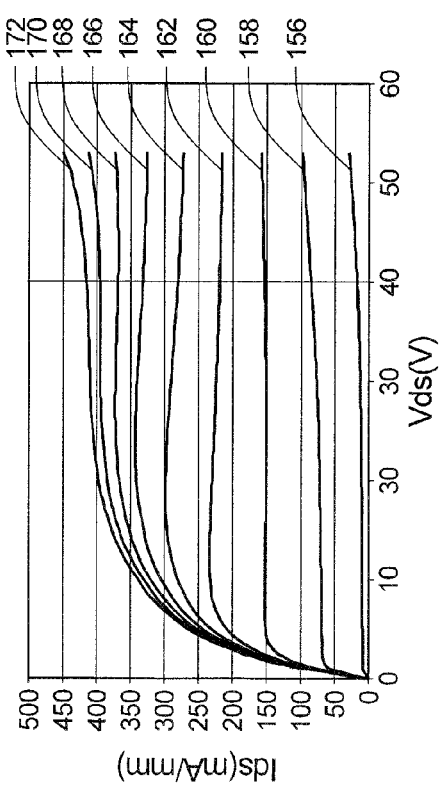

LDMOS DEVICES WITH IMPROVED ARCHITECTURES

FIELD OF THE INVENTION

The present invention relates to high voltage, high power MOSFETs and low voltage, low power MOSFETs.

BACKGROUND OF THE INVENTION

Combining high voltage, high power MOSFETs and low voltage, low power MOSFETs in an integrated circuit generally involves processing steps for forming the high power MOSFETs which are not effectively used to form the low power MOSFETs and other processing steps for forming the low power MOSFETs which are not effectively used to form the high power MOSFETs. Since it is a constant goal to reduce the number of processing steps in the fabrication of an integrated circuit, a common architecture for both types of devices is highly desirable.

SUMMARY OF THE INVENTION

The invention comprises, in one form thereof, an LDMOS device with a substrate of a first conductivity type, a starting epitaxial layer on the substrate, a buried well of a second conductivity type opposite to the first conductivity type in the starting epitaxial layer, the buried well is in the top of the starting epitaxial layer being of the first conductivity type, an in-line epitaxial layer built on the top of the starting epitaxial layer, and a field oxide located between a drain and both a gate on a gate oxide and a source, and a saddle shaped vertical doping gradient of the second conductivity type in the in-line epitaxial layer above the buried well such that the dopant concentration in the in-line epitaxial layer above the buried well and below a central portion of the field oxide is lower than the dopant concentration at the edges of the field oxide nearest the drain and nearest the gate.

The invention comprises, in another form thereof, an LDMOS device including a substrate of a first conductivity type, a starting epitaxial layer on the substrate, a buried well of a second conductivity type opposite to the first conductivity type in the top region of the starting epitaxial layer, the buried well is in the top of the starting epitaxial layer being of the first conductivity type, an in-line epitaxial layer built on the top of the starting epitaxial layer, and a vertical doping gradient of the second conductivity type in the in-line epitaxial layer above the buried well which has a higher dopant concentration near the buried layer and at the top of the in-line epitaxial layer than in a middle region of the in-line epitaxial region, and a source and a drain in an upper portion of the in-line epitaxial layer, a gate oxide on the in-line epitaxial layer, and a gate electrode on the gate oxide.

The invention comprises, in yet another form thereof, a technology comprising a high voltage LDMOS having a substrate of a first conductivity type, a starting epitaxial layer on the substrate, a buried well of a second conductivity type opposite to the first conductivity type in the top region of the starting epitaxial layer, the starting epitaxial layer being of the first conductivity type, an in-line epitaxial layer built on the top of the starting epitaxial layer, a field oxide located between a drain and both a gate on a gate oxide and a source, and a saddle shaped vertical doping gradient of the second conductivity type in the in-line epitaxial layer above the buried well such that the dopant concentration in the epitaxial layer above the buried well and below a central portion of the field oxide is lower than the dopant concentration at the edges of the field oxide nearest the drain and nearest the gate. The technology also includes a low voltage LDMOS comprising a starting epitaxial layer on the substrate, a buried well of a second conductivity type opposite to the first conductivity type in the top region of the starting epitaxial layer, the epitaxial layer being of the first conductivity type, an in-line epitaxial layer built on the top of the starting epitaxial layer, and a vertical doping gradient of the second conductivity type in the in-line epitaxial layer above the buried well which has a higher dopant concentration near the buried layer and at the top of the epitaxial layer than in a middle region of the epitaxial region, and a source and a drain in an upper portion of the in-line epitaxial layer, a gate oxide on the in-line epitaxial layer, and a gate electrode on the gate oxide.

In still another form, the invention includes a method of forming an LDMOS device. The method comprises the steps of forming a starting epitaxial layer on a substrate of a first conductivity type with a buried well in the top region of the starting epitaxial layer of a second conductivity type opposite to the first conductivity type, forming a first conductivity type in-line epitaxial layer on the top of first conductivity type starting epitaxial layer, forming a field oxide in the top edge of the in-line epi layer in an active area of the high voltage LDMOS device, making first, second, and third vertical implants into the epi layer, the field oxide shielding the epi layer from the third implant, and forming a source, drain, and gate on a gate oxide with the drain on one side of the field oxide and the gate and source on an opposite side of the field oxide.

In an additional form, the invention includes a method of forming an LDMOS device. The method comprises the steps of forming a starting epitaxial layer on a substrate of a first conductivity type with a buried well in the top of the epitaxial layer of a second conductivity type opposite to the first conductivity type, forming an in-line epitaxial layer of a first conductivity type on the top of the starting epitaxial layer of a first conductivity type, making first, second, and third vertical implants into the epi layer, the first implant in a portion of the epitaxial layer near the buried layer, the second implant shallower than the first implant, and the third implant shallower than the second implant, the second implant being of a lower dopant concentration than the first and third implants, and forming a source, drain, and gate on a gate oxide with the drain on one side of the field oxide and the gate and source on an opposite side of the field oxide.

In a still additional form, the invention includes a method of forming a high voltage LDMOS and a low voltage LDMOS on a substrate of a first conductivity type. The method of forming the high voltage LDMOS comprising the steps of forming a starting epitaxial layer on the substrate with a buried well in the starting epitaxial layer of a second conductivity type opposite to the first conductivity type and of a first dopant concentration, forming an in-line epitaxial layer of first conductivity type on the top of the starting epitaxial layer of first conductivity type, forming a field oxide in the top edge of the epi layer in an active area of the high voltage LDMOS, making first, second, and third vertical implants into the epi layer, the field oxide shielding the epi layer from the third implant, and forming a source, drain, and gate each at the same time for both devices with the drain on one side of the field oxide and the gate and source on an opposite side of the field oxide high voltage LDMOS. The method of forming the low voltage LDMOS comprising the steps of forming an in-line epitaxial layer on the substrate with a buried well in the starting epitaxial layer of a second conductivity type opposite to the first conductivity type and of a first dopant concentration, forming an in-line epitaxial layer of first conductivity type on the top of the starting epitaxial layer of first conductivity type, forming a field oxide in the top edge of the epi layer in an active area of the high voltage LDMOS, making first, second, and third vertical implants into the epi layer, the field oxide shielding the epi layer from the third implant, and forming a source, drain, and gate each at the same time for both devices with the drain on one side of the field oxide and the gate and source on an opposite side of the field oxide high voltage LDMOS.

BRIEF DESCRIPTION OF THE DRAWINGS

The aforementioned and other features, characteristics, advantages, and the invention in general will be better understood from the following more detailed description taken in conjunction with the accompanying drawings, in which:

FIGS. 1A and 1B are respective diagrammatical views of a high voltage LDMOS and a low voltage LDMOS according to an embodiment of the current invention;

FIG. 4 is a diagrammatical view of a later process step than the process step shown in FIGS. 3A and 3B for the high voltage LDMOS shown in FIG. 1A;

FIGS. 5A and 5B are diagrammatical views of a later process step than the process step shown in FIGS. 3A, 3B, and 4 for the high voltage LDMOS and the low voltage LDMOS, respectively, shown in FIGS. 1A and 1B;

FIGS. 8A and 8B are diagrammatical views of a later process step than the process step shown in FIGS. 7A and 7B for the high voltage LDMOS and the low voltage LDMOS, respectively, shown in FIGS. 1A and 1B;

FIGS. 14A and 14B are graphical representations of the forward voltage and current characteristics, and the reverse voltage and current characteristics, respectively, of a 20 volt LDMOS according to the present invention;

FIGS. 15A and 15B are graphical representations of the forward voltage and current characteristics, and the reverse voltage and current characteristics, respectively, of a 40 volt LDMOS according to the present invention;

Figure 1C:
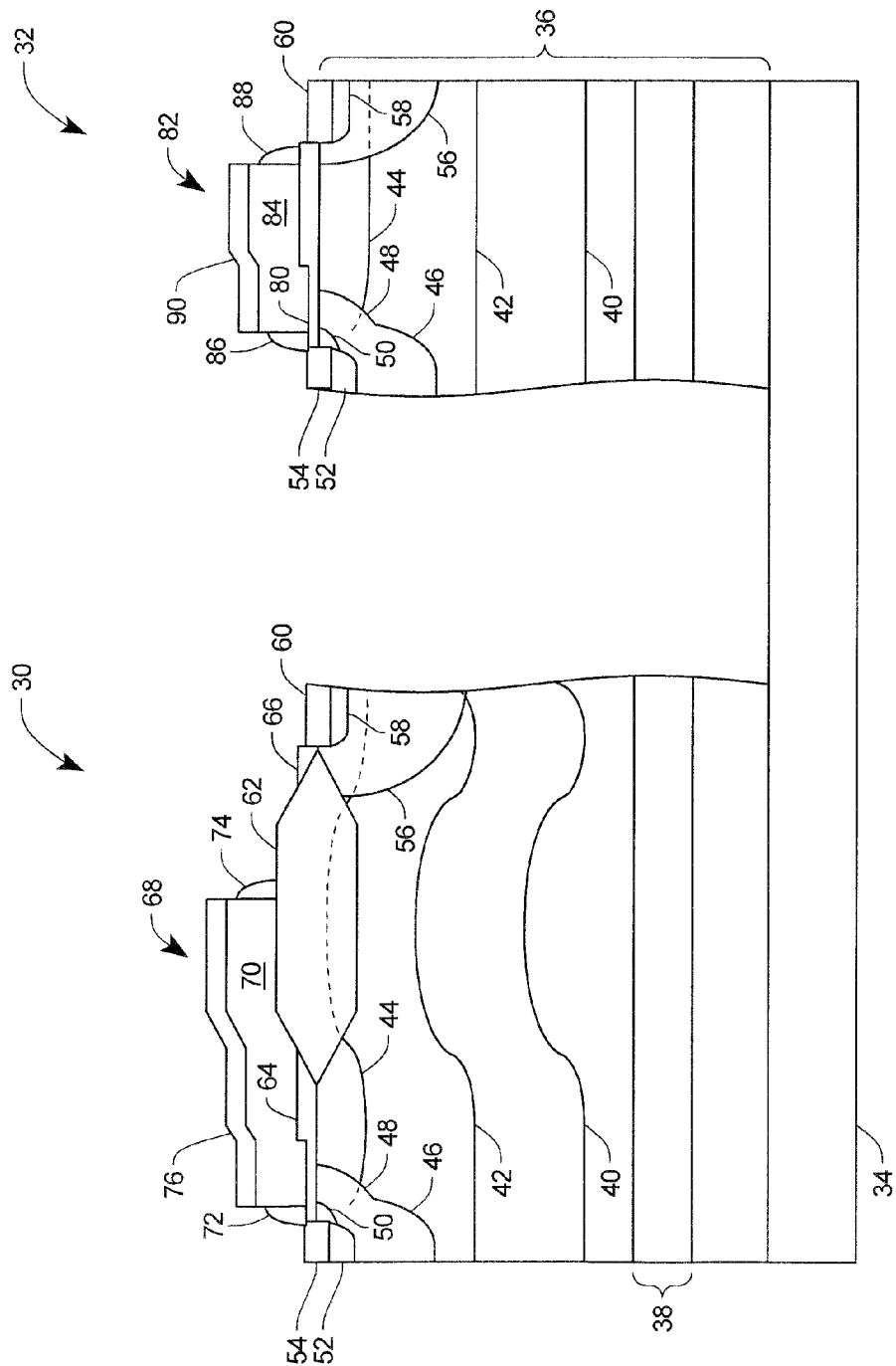
FIG. 1C is a diagrammatical view of a high voltage LDMOS and a low voltage LDMOS formed on the same substrate according to an embodiment of the current invention.

It will be appreciated that for purposes of clarity and where deemed appropriate, reference numerals have been repeated in the figures to indicate corresponding features. Also, the relative size of various objects in the drawings has in some cases been distorted to more clearly show the invention.

DETAILED DESCRIPTION

Turning now to the drawings. FIGS. 1A and 1B are respective diagrammatical views of a high voltage LDMOS 30 according to one embodiment of the present invention and a low voltage LMOS 32 according to another embodiment of the present invention. The invention may, however, be embodied in different forms and should not be construed as limited to the embodiments set forth herein. Rather, these embodiments are provided so that this disclosure will be thorough and complete, and will fully convey the scope of the invention to those skilled in the art.

The high voltage LDMOS 30 and the low voltage LDMOS 32 have a highly doped substrate 34 of a first conductivity type. The terms "first conductivity type" and "second conductivity type" refer to opposite conductivity types such as N or P type, however, each embodiment described and illustrated herein includes its complementary embodiment as well. In the embodiments described herein, the first conductivity type is P type, and the second conductivity type is N type. Thus the highly doped substrate 34 will be described an a P+ substrate to facilitate the description of FIGS. 1A and 1B. An epitaxial (epi) layer 36 is grown on the substrate 34, which includes a starting epi and an in-line epi, and an N type buried well 38 is formed in the top area of the starting epi that is lower portion of the epi layer 36.

An in-line epi is built on the top of the starting epi after forming the N type buried well 38, following by a field oxide 62 made on the top of the drift region of the high voltage LDMOS 30. Three N type implants are made in the in-line epi that is the upper portion of the epi layer 36 in the high voltage LDMOS 30 and the low voltage LDMOS 32. The first implant 40 is closest to the buried well 38, the second implant 42 is shallower than the first implant 40, and the third implant 44 is shallower than the second implant 42. Each of the active areas shown in FIGS. 1A and 1B lie in the upper portion of the epi layer 36 and include a P well 46 formed below the upper surface of the epi layer 36 with a P body 48 formed between the P well 46 and the upper surface of the epi layer 36. The P body 48 is formed using a low tilt angle implant, which may be 7°, but not limited to low tilt angle implant. Contiguous with the inside curve of the P body 48 is an N+ source spacer 50, which is formed using the same mask as P body 48 by dual implants, one for P body 48 and the other one for N+ source spacer 50. A bulk P+ 52 is formed in the P well 46 and the P body 48 and may be contiguous with the N+ source spacer 50, self-aligned with oxide spacer 72, or with a space to oxide spacer. A source silicide 54 is formed in the upper surface of the epi layer 36 over the bulk P+ 52 and contacts with the bulk P+ 52 and N+ source spacer 50.

An N well 56 is formed in another portion of the epi layer 36 which may extend from the upper surface of the epi layer 36 downward. An N+ drain 58 is formed in the N well 56 and is capped by a drain silicide 60.

In the high voltage LDMOS 30 the field oxide 62 is formed in the upper surface of the epi layer 36 above a portion of the region between the P body 48 and N well 56, and may extend into a portion of the N well 56. A stepped gate oxide 64 lies on the upper surface of the epi layer 36 between the source silicide 54 and the field oxide 62. Another oxide layer 66 on the surface of the epi layer 36 extends from the field oxide 62 to the drain silicide 60. A gate 68, which includes a gate electrode 70 which may be doped polysilicon, lies on a portion of the stepped gate oxide 64. The gate electrode 70 extends on top of a portion of the field oxide 62 to form a poly field plate. The combination of the stepped gate oxide 64 and the poly field plate of the gate electrode 70 reduces the surface electric field compared to conventional LDMOS devices. The gate 68 includes a first gate sidewall oxide 72 over the N+ source spacer 50, and a second gate sidewall oxide 74 over the field oxide 62. The gate 68 may have a gate silicide layer 76 formed in the top surface of the gate electrode 70.

In the low voltage LDMOS 32 a stepped gate oxide 80 lies on the upper surface of the epi lay 36 between the source silicide 54 and the drain silicide 60. A gate 82, which includes a gate electrode 84 which may be doped polysilicon, lies on a portion of the stepped gate oxide 80. The gate 82 includes a first gate sidewall oxide 86 over the N+ source spacer 50 on the top of the thin gate oxide, and a second gate sidewall oxide 88 on the top of thick gate oxide. The gate 82 may have a gate silicide layer 90 formed in the top surface of the gate electrode 84.

Figure 2A:
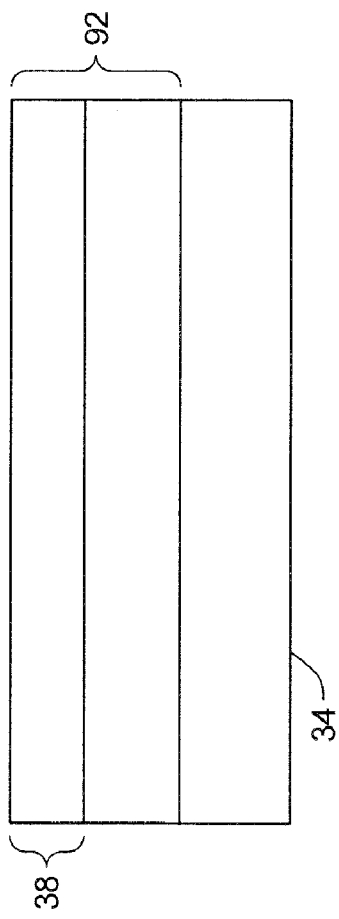
FIGS. 2A and 2B are respective diagrammatical views of an early process step for the high voltage LDMOS and the low voltage LDMOS shown in FIGS. 1A and 1B.
Figure 2B:
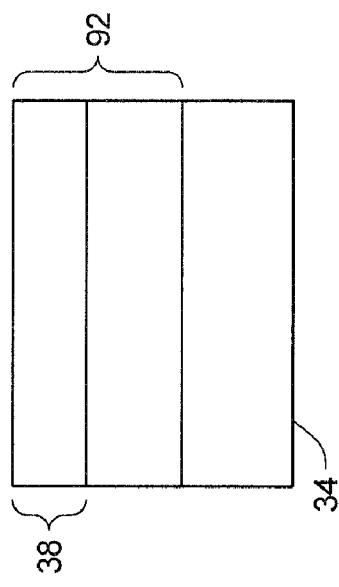

FIG. 1C is a diagrammatical view of the high voltage LDMOS 30 and the low voltage LDMOS 32 formed on the same substrate 34 according to an embodiment of the current invention FIGS. 2A and 2B show one stage in the fabrication of the high voltage LDMOS 30 and the low voltage LDMOS 32, respectively, in which a thin starting P− epi layer 92 has been grown on the substrate 34, and the buried well 38 has been formed in the P− epi layer 92. The buried well 38 in the high voltage LDMOS 30 may have a dopant concentration in the range of $0.5 \times 10^{16}$ cm$^{-3}$ to $5.5 \times 10^{16}$ cm$^{-3}$ with a preferred dopant concentration of about $2.5 \times 10^{16}$ cm$^{-3}$, and the buried well 38 in the low voltage LDMOS 32 may have a dopant concentration in the range of $5.5 \times 10^{16}$ cm$^{-3}$ to $5 \times 10^{16}$ cm$^{-3}$ with a preferred dopant concentration of about $1.0 \times 10^{17}$ cm$^{-3}$ in one embodiment, and may have a dopant concentration in the range of $5 \times 10^{18}$ cm$^{-3}$ to $5 \times 10^{19}$ cm$^{-3}$ with a preferred dopant concentration of about $7.0 \times 10^{18}$ cm$^{-3}$ in another embodiment of the low voltage LDMOS 32.

Figure 3B:
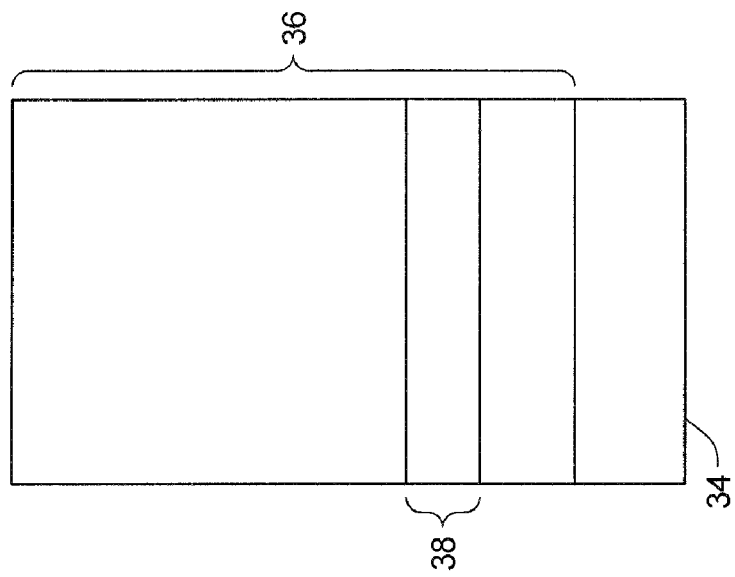
FIGS. 3A and 3B are diagrammatical views of a later process step than the process step shown in FIGS. 2A and 2B for the high voltage LDMOS and the low voltage LDMOS, respectively, shown in FIGS. 1A and 1B.
Figure 3A:
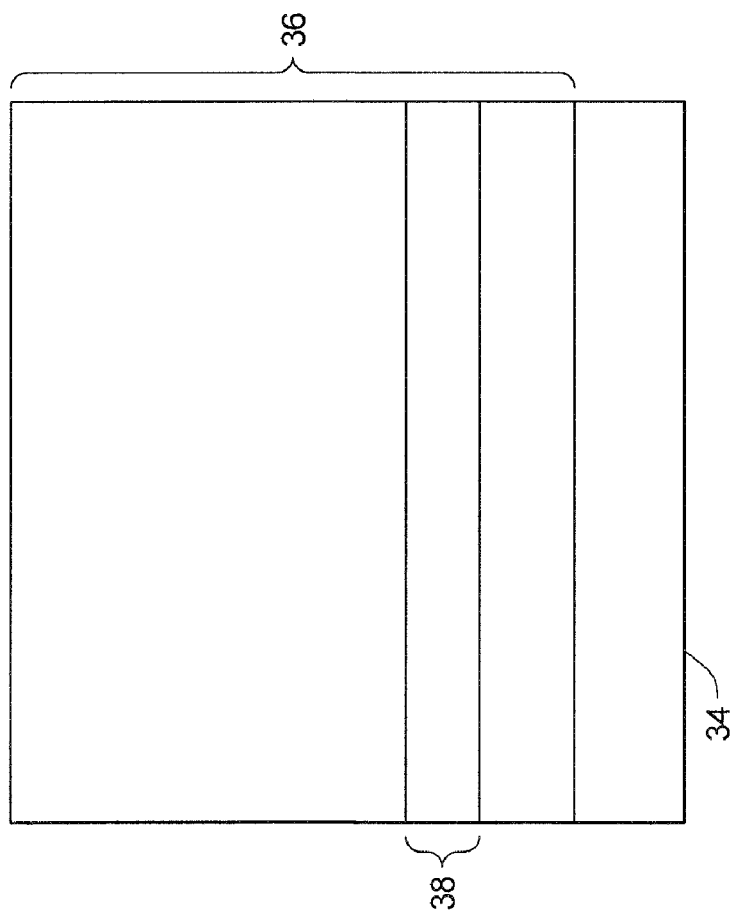

FIGS. 3A and 3B show the high voltage LDMOS 30 and low voltage LDMOS 32 after another epitaxial growth operation to complete the P− epi 36 with the buried well 38 in the lower portion of the p− epi layer 36.

FIG. 4 shows another stage in the fabrication of the high voltage LDMOS 30 after the field oxide 62 has been formed in the upper surface of the epi layer 36.

FIGS. 5A and 5B show still another stage in the fabrication of the high voltage LDMOS 30 and the low voltage LDMOS 32, respectively, after the three implants 40, 42, and 44, which may be retrograde implants, have been formed. The first implant 40, which extends from the top surface of the epi layer 36 to a specified depth proximate to the buried layer 38, may have a dopant concentration in the range of $0.5 \times 10^{16}$ cm$^{-3}$ to $3 \times 10^{17}$ cm$^{-3}$ with a preferred dopant concentration of about $1.2 \times 10^{16}$ cm$^{-3}$. The second implant 42, which extends from the top surface of the epi layer 36 to a specified depth shallower than the first implant 40, may have a dopant concentration in the range of $1 \times 10^{15}$ cm$^{-3}$ to $1 \times 10^{17}$ cm$^{-3}$ with a preferred dopant concentration of about $7.0 \times 10^{15}$ cm$^{-3}$. The third implant 44, which extends from the top surface of the epi layer 36 to a specified depth shallower than the second implant 42, may have a dopant concentration in the range of $3 \times 10^{15}$ cm$^{-3}$ to $2 \times 10^{17}$ cm$^{-3}$ with a preferred dopant concentration of about $10 \times 10^{16}$ cm$^{-3}$.

In the low voltage LDMOS 32, the three implants form straight line dopant regions. However, in the high voltage LDMOS 30, the field oxide absorbs some of the energy of the implanted ions, and the dopant layers have a saddle shape to them, being shallower in the region under the field oxide 62 than the regions not shadowed by the field oxide 62. As a result the third implant 44 does not extend into the epi layer 36 under the field oxide 62, and therefore the epi layer under the field oxide 62 is more lightly doped N type than the surface layer of the epi layer 36 in the low voltage LDMOS 32. The drift region for the high voltage LDMOS 30 is the lateral region which is under the field oxide 62 and is bounded by the third implant 44 in the epi layer 36 nearest the P body 48, and bounded by either the third implant 44 in the epi layer 36 nearest the N well 56 or the N well 56 if the N well 56 extends under the field oxide 62 far enough to include any of the third implant 44 on the N well 56 side of the field oxide 62. As a consequence, the high voltage LDMOS 30 has a relatively lightly doped drift region under the field oxide 62 compared to the surface layer of the low voltage LDMOS 32 providing dopant profiles in the epi layers 36 appropriate for a high voltage LDMOS and a low voltage LDMOS, and different drift region doping profiles in both devices 30, 32 can be built in the same process step.

Also, the saddle shaped first and second implants, 40 and 42, respectively, and the buried well 38 in the high voltage LDMOS 30 provide, in an embodiment of the invention, (a) a relatively higher source to substrate breakdown voltage although with a thin epi layer compared to conventional LDMOS devices, (b) a relatively lower parasitic NPN beta compared to conventional LDMOS devices due to thin epi layer and p+ substrate, and (c) improved current flow distribution compared to conventional LDMOS devices due to retrograde drift doping, graded drain doping and N+ source spacer with a step body shown in the following drawings, which together provide a larger safe operating area (SOA) compared to conventional LDMOS devices.

Figure 6B:
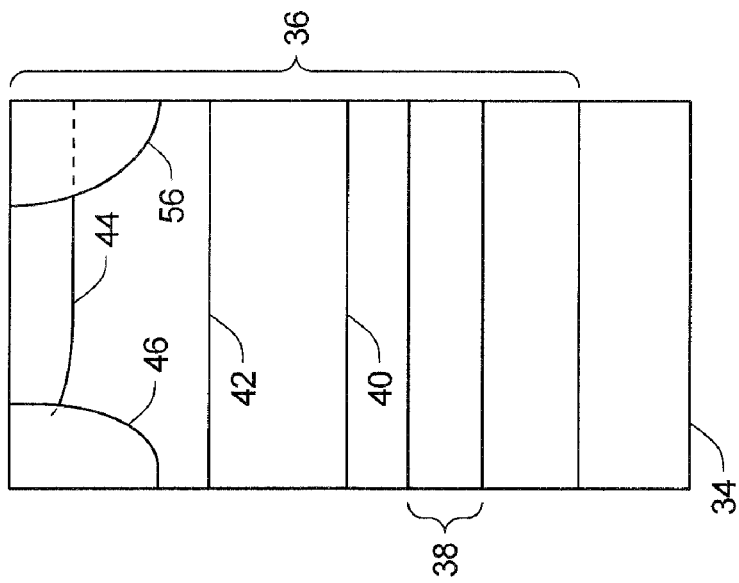
FIGS. 6A and 6B are diagrammatical views of a later process step than the process step shown in FIGS. 5A and 5B for the high voltage LDMOS and the low voltage LDMOS, respectively, shown in FIGS. 1A and 1B.
Figure 6A:
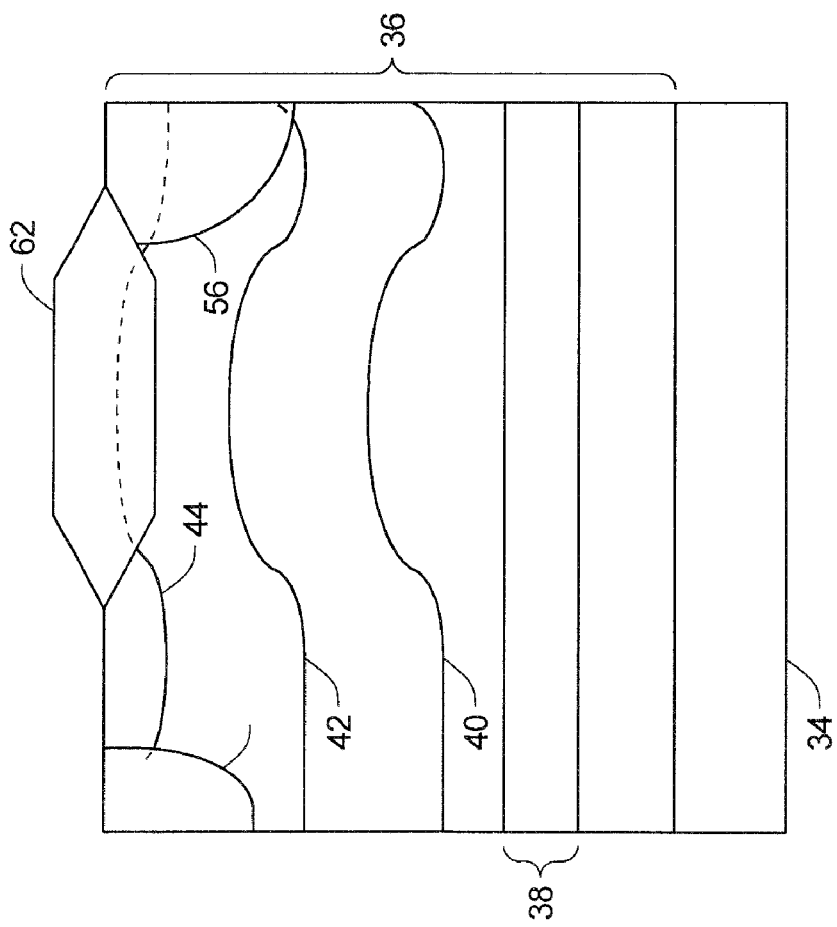

FIGS. 6A and 6B shows the high voltage LDMOS 30 and the low voltage LDMOS 32 after the P wells 46 and the N wells 56 have been formed.

Figure 7B:
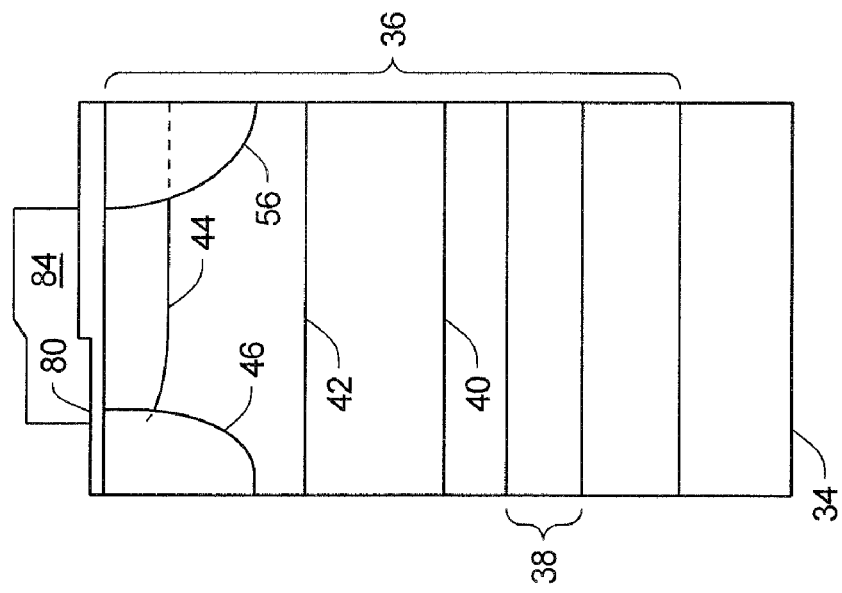
FIGS. 7A and 7B are diagrammatical views of a later process step than the process step shown in FIGS. 6A and 6B for the high voltage LDMOS and the low voltage LDMOS, respectively, shown in FIGS. 1A and 1B.
Figure 7A:
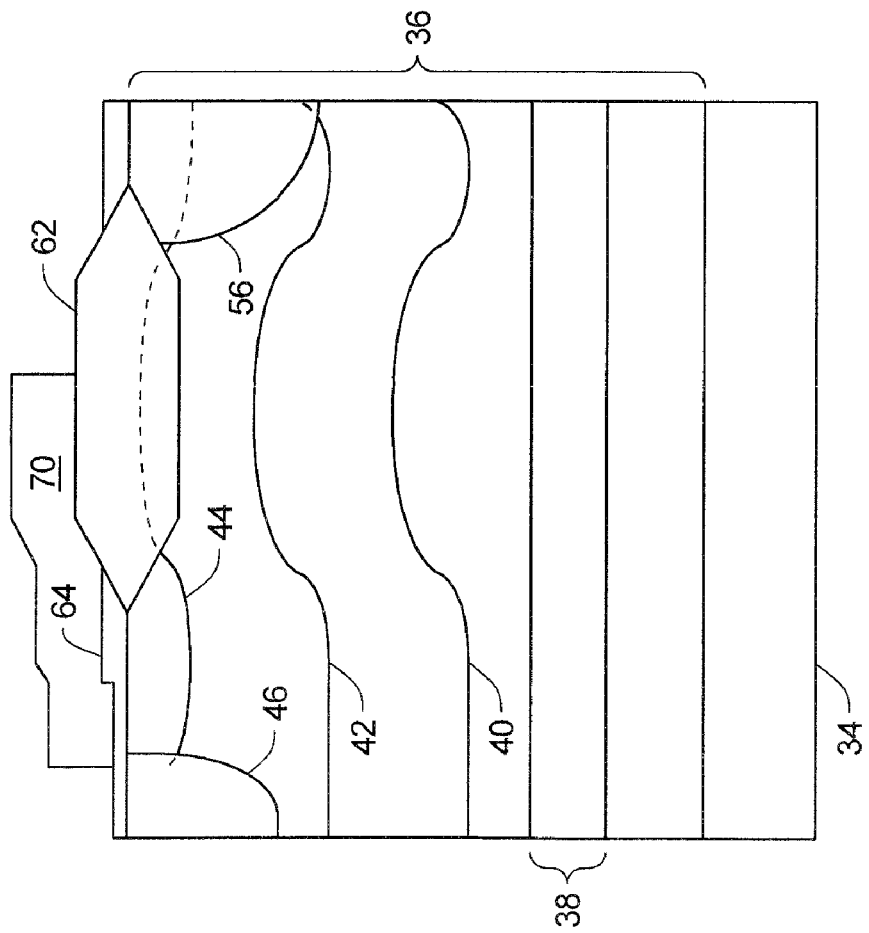

FIGS. 7A and 7B show the addition of the stepped gate oxides 64, 80 and the gate electrodes 70, 84 to the high voltage LDMOS 30 and the low voltage LDMOS 32, respectively. FIGS. 8A and 8B show the structure of FIGS. 7A and 7B after the P body 48 and the N+ source spacer 50 have been formed using a low tilt angle implant. Both the P body 48 and the N+ source spacer 50 are self aligned with the gate electrodes 70, 84. The P body implant tilt angle may be 7°, the implant energy may be relatively low, about 60 kev, and the implant dopant may be boron.

Therefore, the P body 48 implant is compatible with a fine process code with thin gate poly and thin gate oxide without degrading the temperature, humidity, and bias (THB) and the high temperature reverse bias (HTRB) characteristics due to the penetration of the P body boron implant into the gate oxide. The low tilt angle implant lessens the shadow effect of the gate and photoresist stack, therefore, the P body and N+ source spacer mask opening may be very small, which reduces the source areas of these devices. The N+ source spacer 50 underneath the sidewall oxides 72, 86 built in the step body, consisting of the P well 46 and the P body 48, lessens premature punch-through and charge reduction in the intrinsic NPN base.

Figure 9B:
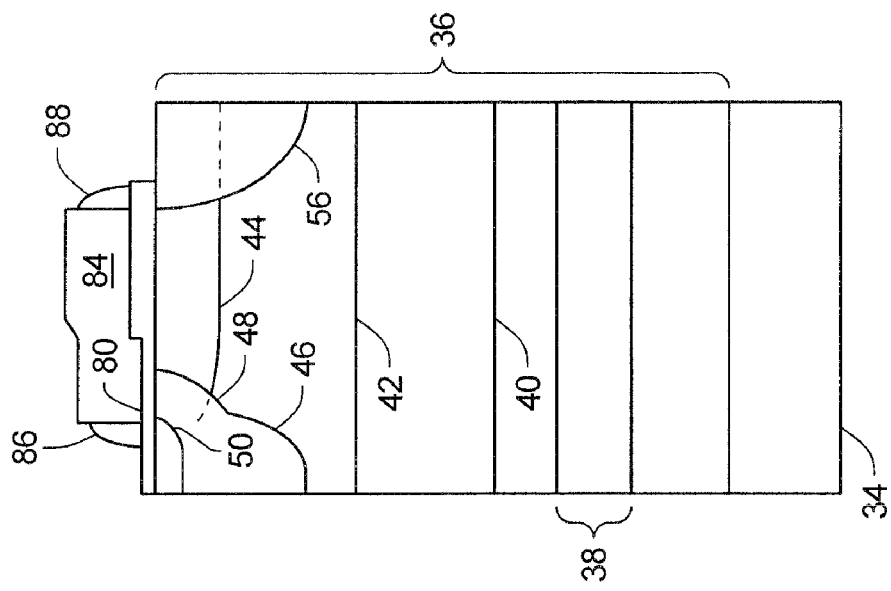
FIGS. 9A and 9B are diagrammatical views of a later process step than the process step shown in FIGS. 8A and 8B for the high voltage LDMOS and the low voltage LDMOS, respectively, shown in FIGS. 1A and 1B.
Figure 9A:
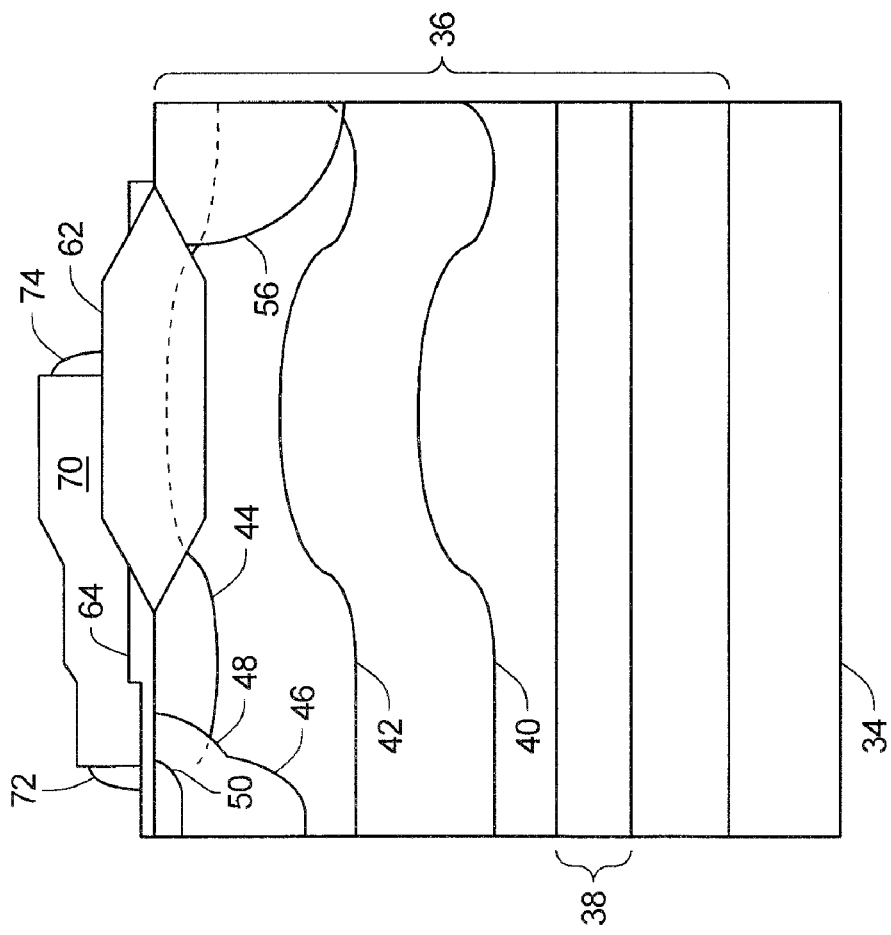
Figure 10B:
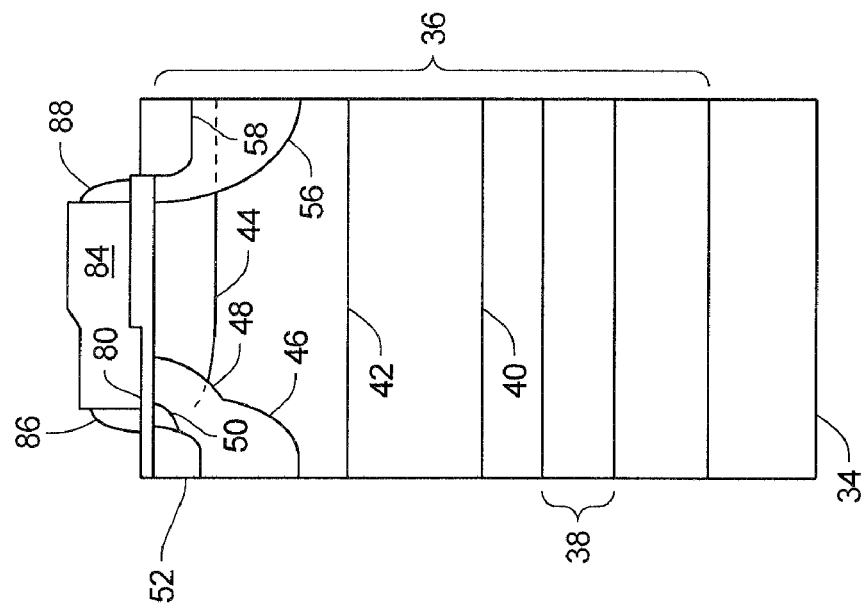
FIGS. 10A and 10B are diagrammatical views of a later process step than the process step shown in FIGS. 9A and 9B for the high voltage LDMOS and the low voltage LDMOS, respectively, shown in FIGS. 1A and 1B.
Figure 10A:
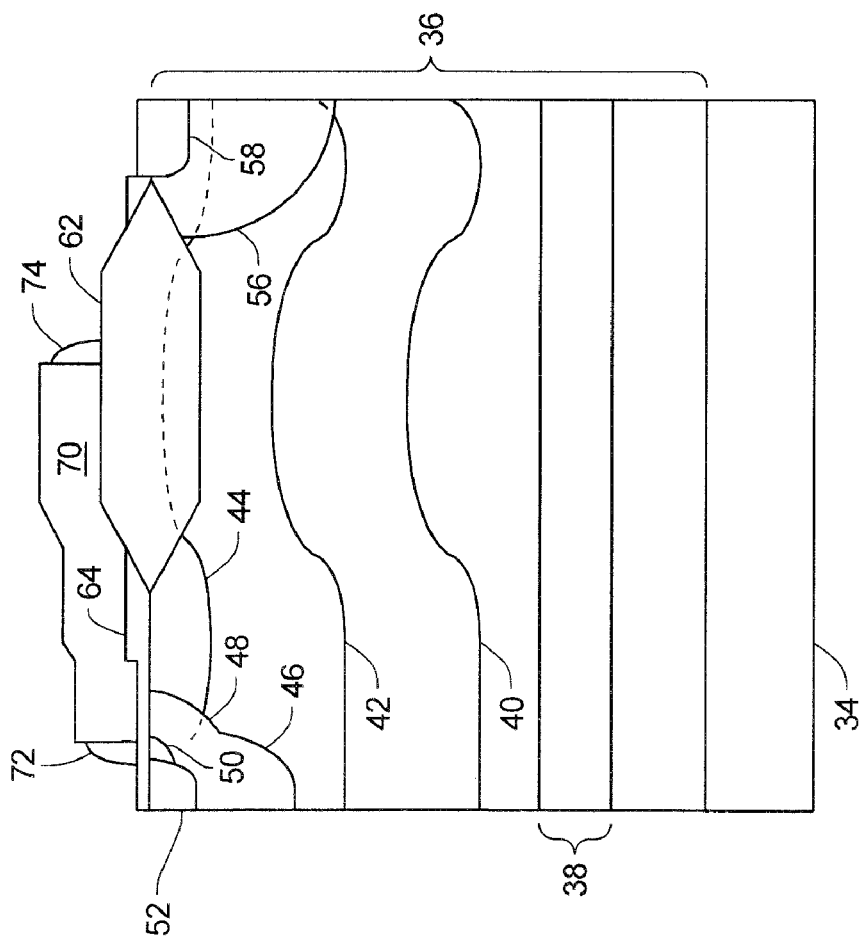

In FIGS. 9A and 9B the gate oxide sidewalls 72, 74, 86, and 88 have been formed. FIGS. 10A and 10B show the high power LDMOS 30 and the low power LDMOS 32, respectively, after the N+ drains 58 and the bulk P+ regions 52 have been formed. The bulk P+ regions 52 are self aligned with the gate oxides sidewalls 72 and 86. Therefore, the effective N+ source is only underneath the oxide sidewall spacer 86. In another embodiment (not shown in the drawings) in which the sidewall oxides may be too narrow to prevent the bulk P+ dopant from penetrating the channel area, the bulk P+ regions 52 may be formed with a space between the bulk P+ regions 52 and the sidewall oxides 72, 86 The N+ drains 58, the first, second, and third implants, 40, 42, 44, respectively, and the N wells 38 form a graded drain doping profile.

Figure 11:
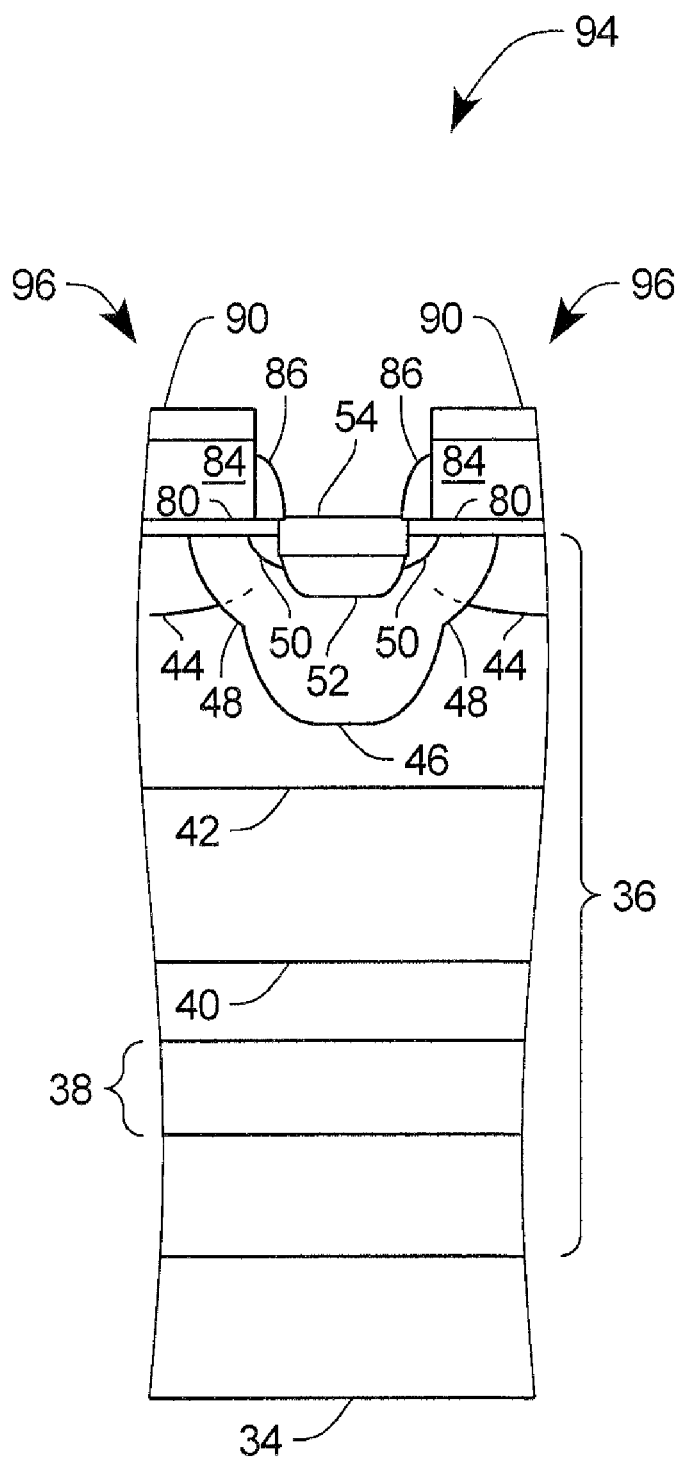
FIG. 11 is a diagrammatical view of the interface of the source areas of either two high power LDMOS devices shown in FIG. 1A, or two low power LDMOS devices shown in FIG. 1B.
Figure 12A:
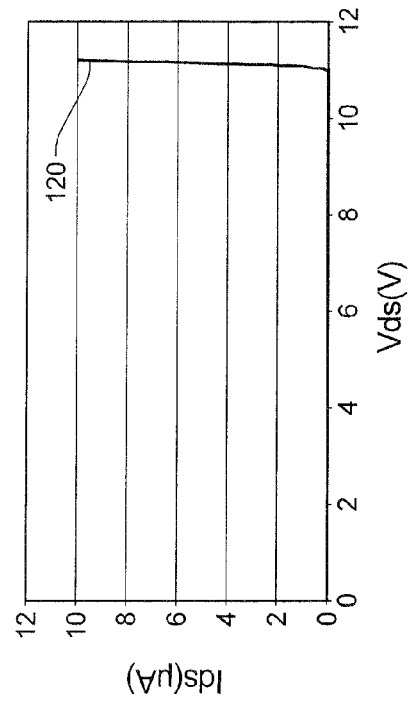
FIGS. 12A and 12B are graphical representations of the forward voltage and current characteristics, and the reverse voltage and current characteristics, respectively, of a 5 volt LDMOS according to the present invention.
Figure 12B:
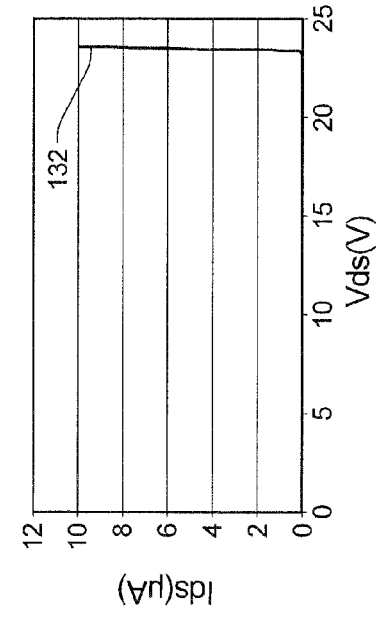

FIG. 11 is an example a diagrammatical diagram 94 of an example of the interface of the source areas 96 of either two stripes of the high power LDMOS device 30 or two stripes of the low power LDMOS device 32. The common self aligned bulk P+ 52 and P well 46 contribute to a minimum pitch size which, in one embodiment, is essentially equal to the pitch of a conventional low voltage nmos source region which has only an N+ source and a minimum space between the gate electrodes 84. The pitch size for the low voltage LDMOS 32 in one embodiment may be as low as 0.5 μm using a 0.35 μm process. In addition, the source pitch for the high voltage LDMOS 30 is equal, in one embodiment, to the source pitch of a conventional low voltage CMOS device FIGS. 12A and 12B are graphical representations of initial silicon results for an embodiment of a 5 volt low power LDMOS 32 showing the drain current density, Ids(mA/mm), with respect to the drain-to-source voltage (Vds) for a plurality of gate-to-source voltages (FIG. 12A), and the drain current (Ids) with respect to the reverse bias Vds (FIG. 12B). The low power LDMOS 32 having the characteristics shown in FIGS. 12A and 12B has an $R_{dson} \cdot A$ of 2.34 mΩ·mm². The following table identifies for each of the curves shown in FIG. 12A the corresponding gate-to-source voltage (Vgs):

| Reference No. | Vgs |
|---|---|
| 100 | 1.0 V |
| 102 | 1.5 V |
| 104 | 2.0 V |
| 106 | 2.5 V |
| 108 | 3.0 V |
| 110 | 3.5 V |
| 112 | 4.0 V |
| 114 | 4.5 V |
| 116 | 5.0 V |
| 118 | 5.5 V |

As shown in FIG. 12B the reverse bias drain-to-source current 120 is close to zero until the reverse bias voltage reaches approximately 11 volts.

Figure 13A:
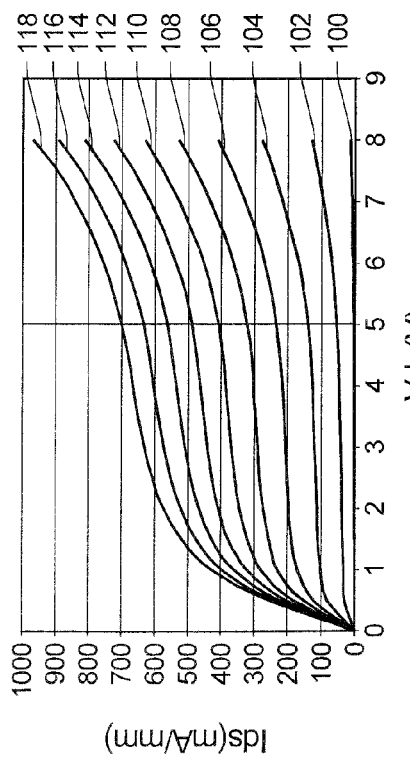
FIGS. 13A and 13B are graphical representations of the forward voltage and current characteristics, and the reverse voltage and current characteristics, respectively, of a 12 volt LDMOS according to the present invention.
Figure 13B:
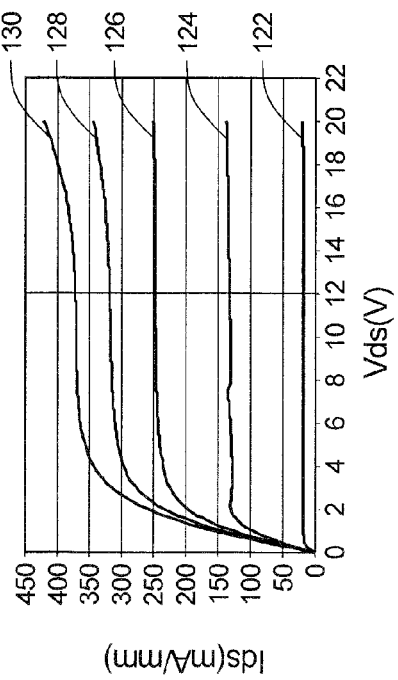

FIGS. 13A and 13B are graphical representations of initial silicon results for an embodiment of a 12 volt low power LDMOS 32 showing the current density, Ids(mA/mm), with respect to Vds for a plurality of gate-to-source voltages (FIG. 13A), and the drain current, Ids, and with respect to the reverse bias Vds (FIG. 13B). The low power LDMOS 32 having the characteristics shown in FIGS. 13A and 13B has an $R_{dson} \cdot A$ of 11.1 mΩ·mm². The following table identifies for each of she curves shown in FIG. 12A the corresponding Vgs:

| Reference No. | Vgs |
|---|---|
| 122 | 2 V |
| 124 | 3 V |
| 126 | 4 V |
| 128 | 5 V |
| 130 | 6 V |

As shown in FIG. 13B the reverse bias drain-to-source current 132 is close to zero until the reverse bias voltage reaches approximately 23 volts.

FIGS. 14A and 14B are graphical representations of initial silicon results for an embodiment of a 20 volt low power LDMOS 32 showing the current density, Ids(mA/mm), with respect to Vds for a plurality of gate-to-source voltages (FIG. 14A), and the drain current, Ids, and with respect to the reverse bias Vds (FIG. 14B). The low power LDMOS 32 having the characteristics shown in FIGS. 14A and 14B has an $R_{dson} \cdot A$ of 22.2 mΩ·mm². The following table identifies for each of the curves shown in FIG. 14A the corresponding Vgs:

| Reference No. | Vgs |
|---|---|
| 136 | 1.5 V |
| 138 | 2.0 V |
| 140 | 2.5 V |
| 142 | 3.0 V |
| 144 | 3.5 V |
| 146 | 4.0 V |
| 148 | 4.5 V |
| 150 | 5.0 V |
| 152 | 5.5 V |

As shown in FIG. 14B the reverse bias drain-to-source current 154 is close to zero until the reverse bias voltage reaches approximately 34 volts.

FIGS. 15A and 15B are graphical representations of initial silicon results for an embodiment of a 40 volt high power LDMOS 30 showing the current density, Ids(mA/mm), with respect to Vds for a plurality of gate-to-source voltages (FIG. 15A), and the drain current, Ids, and with respect to the reverse bias Vds (FIG. 15B). The high power LDMOS 30 having the characteristics shown in FIGS. 15A and 15B has an $R_{dson} \cdot A$ of 53.4 mΩ·mm². The following table identifies for each of the curves shown in FIG. 15A the corresponding Vgs:

| Reference No. | Vgs |
|---|---|
| 156 | 1.5 V |
| 158 | 2.0 V |
| 160 | 2.5 V |

-continued

| Reference No. | Vgs |
|---|---|
| 162 | 3.0 V |
| 164 | 3.5 V |
| 166 | 4.0 V |
| 168 | 4.5 V |
| 170 | 5.0 V |
| 172 | 5.5 V |

As shown in FIG. 15B the reverse bias drain-to-source current 174 is close to zero until the reverse bias voltage reaches approximately 55 volts.

Figure 16B:
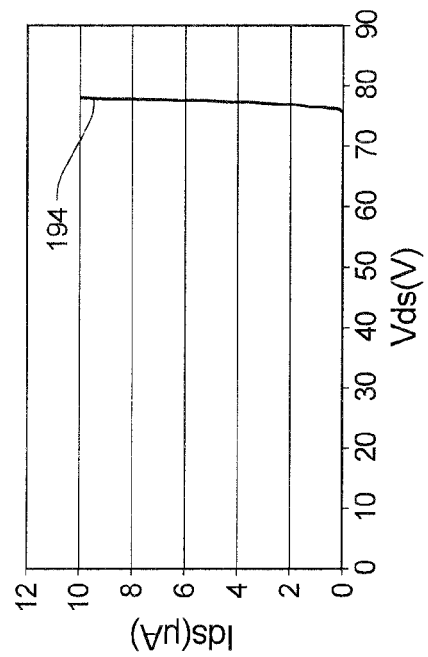
FIGS. 16A and 16B are graphical representations of the forward voltage and current characteristics, and the reverse voltage and current characteristics, respectively, of a 60 volt LDMOS according to the present invention.
Figure 16A:
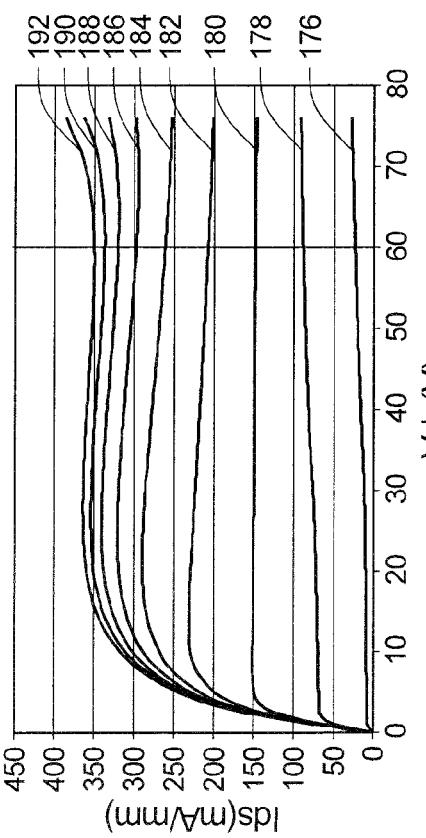

FIGS. 16A and 16B are graphical representations of initial silicon results for an embodiment of a 60 volt high power LDMOS 30 showing the current density, Ids(mA/mm), with respect to Vds for a plurality of gate-to-source voltages (FIG. 16A), and the drain current, Ids, and with respect to the reverse bias Vds (FIG. 16B). The high power LDMOS 30 having the characteristics shown in FIGS. 16A and 16B has an $R_{dson} \cdot A$ of 97.3 m$\Omega \cdot$mm$^2$. The following table identifies for each of the curves shown in FIG. 16A the corresponding Vgs:

| Reference No. | Vgs |
|---|---|
| 176 | 1.5 V |
| 178 | 2.0 V |
| 180 | 2.5 V |
| 182 | 3.0 V |
| 184 | 3.5 V |
| 186 | 4.0 V |
| 188 | 4.5 V |
| 190 | 5.0 V |
| 192 | 5.5 V |

As shown in FIG. 16B the reverse bias drain-to-source current 194 is close to zero until the reverse bias voltage reaches approximately 77 volts.

Figure 17B:
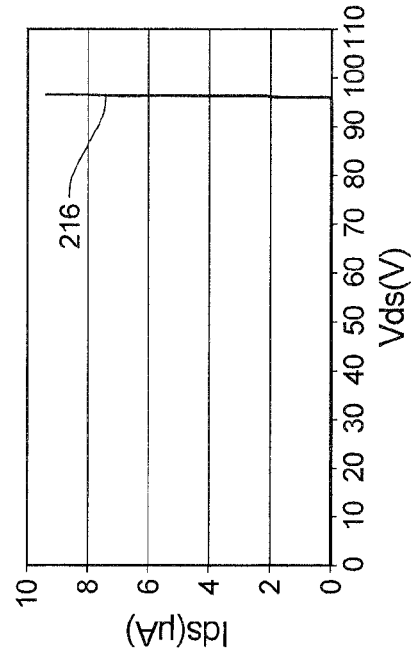
FIGS. 17A and 17B are graphical representations of the forward voltage and current characteristics, and the reverse voltage and current characteristics, respectively, of a 80 volt LDMOS according to the present invention.
Figure 17A:
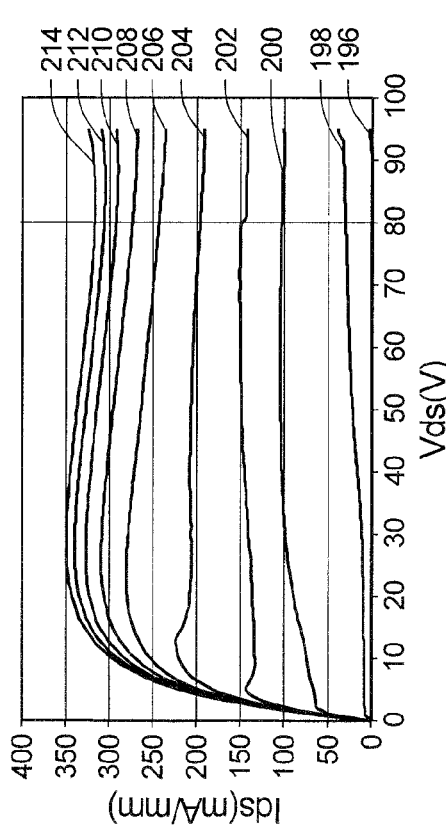

FIGS. 17A and 17B are graphical representations of initial silicon results for an embodiment of a 80 volt high power LDMOS 30 showing the current density, Ids(mA/mm), with respect to Vds for a plurality of gate-to-source voltages (FIG. 17A), and the drain current, Ids, and with respect to the reverse bias Vds (FIG. 17B). The high power LDMOS 30 having the characteristics shown in FIGS. 17A and 17B has an $R_{dson} \cdot A$ of 155.6 m$\Omega \cdot$mm$^2$. The following table identifies for each of the curves shown in FIG. 17A the corresponding Vgs:

| Reference No. | Vgs |
|---|---|
| 196 | 1.0 V |
| 198 | 1.5 V |
| 200 | 2.0 V |
| 202 | 2.5 V |
| 204 | 3.0 V |
| 206 | 3.5 V |
| 208 | 4.0 V |
| 210 | 4.5 V |
| 212 | 5.0 V |
| 214 | 5.5 V |

As shown in FIG. 17B the reverse bias drain-to-source current 216 is close to zero until the reverse bias voltage reaches approximately 97 volts.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

The invention claimed is:

1. An LDMOS device comprising:
   a) a substrate of a first conductivity type;
   b) an epitaxial layer on said substrate;
   c) a buried well of a second conductivity type opposite to said first conductivity type in a lower portion of said epitaxial layer, said epitaxial layer being of said first conductivity type below said buried well;
   d) a field oxide located between a drain and both a gate on a gate oxide and a source;
   e) a saddle shaped vertical doping gradient of said second conductivity type in said epitaxial layer above said buried well such that the dopant concentration in said epitaxial layer above said buried well and below a central portion of said field oxide is lower than the dopant concentration at the edges of said field oxide nearest said drain and nearest said gate; and
   f) a P well located in a source region and an N well located in a drain region.

2. The device of claim 1 wherein said gate oxide is a stepped gate oxide.

3. The device of claim 1 wherein said source is an N+ source spacer located under a sidewall oxide of said gate and self aligned with an edge of said gate.

4. The device of claim 3 further including a P body in contact with said N+ spacer and self aligned with said edge of said gate.

5. The device of claim 4 further including a P+ bulk in contact with said P body and said N+ spacer and self aligned with said gate sidewall oxide.

6. The device of claim 1 wherein said gate comprises a poly field plate.

7. The device of claim 1 wherein said gradient monotonically decreases upward from said buried well to said field oxide.

8. An LDMOS device comprising:
   a) a substrate of a first conductivity type;
   b) an epitaxial layer on said substrate;
   c) a buried well of a second conductivity type opposite to said first conductivity type in a lower portion of said epitaxial layer, said epitaxial layer being of said first conductivity type below said buried well;
   d) a vertical doping gradient of said second conductivity type in said epitaxial layer above said buried well which has a higher dopant concentration near said buried well and at the top of said epitaxial layer than in a middle region of said epitaxial region;
   e) a source and a drain in an upper portion of said epitaxial layer, a gate oxide on said epitaxial layer, and a gate electrode on said gate oxide; and
   f) a P well located in a source region and an N well located in a drain region.

9. The device of claim 8 wherein said gate oxide is a stepped gate oxide.

10. The device of claim 8 wherein said source is an N+ source spacer located under a sidewall oxide of said gate and self aligned with an edge of said gate.

11. The device of claim 10 further including a P body in contact with said N+ spacer and self aligned with said edge of said gate.

12. The device of claim 11 further including a P+ bulk in contact with said P body and said N+ spacer and self aligned with said gate sidewall oxide.

13. A semiconductor device comprising:
 a) a high voltage LDMOS comprising:
  i) a substrate of a first conductivity type;
  ii) a first epitaxial layer on said substrate;
  iii) a first buried well of a second conductivity type opposite to said first conductivity type in a lower portion of said first epitaxial layer, said first epitaxial layer being of said first conductivity type below said first buried well;
  iv) a field oxide located between a drain and both a gate on a gate oxide and a source;
  v) a saddle shaped vertical doping gradient of said second conductivity type in said first epitaxial layer above said first buried well such that the dopant concentration in said first epitaxial layer above said first buried well and below a central portion of said field oxide is lower than the dopant concentration at the edges of said field oxide nearest said drain and nearest said gate; and
  vi) a P well located in a source region and an N well located in a drain region;
 and
 b) a low voltage LDMOS comprising:
  i) a second epitaxial layer on said substrate;
  ii) a second buried well of a second conductivity type opposite to said first conductivity type in a lower portion of said second epitaxial layer, said second epitaxial layer being of said first conductivity type below said second buried well;
  ii) a vertical doping gradient of said second conductivity type in said second epitaxial layer above said second buried well which has a higher dopant concentration near said second buried well and at the top of said second epitaxial layer than in a middle region of said second epitaxial region; and
  iii) a source and a drain in an upper portion of said second epitaxial layer, a gate oxide on said second epitaxial layer, and a gate electrode on said gate oxide; and
  iv) a P well located in a source region and an N well located in a drain region.

14. The device of claim 13 wherein said gate oxide is a stepped gate oxide in said high voltage LDMOS and in said low voltage LDMOS.

15. The device of claim 13 wherein said source is an N+ source spacer located under a sidewall oxide of said gate and self aligned with an edge of said gate in said high voltage LDMOS and in said low voltage LDMOS.

16. The device of claim 15 further including a P body in contact with said N+ spacer and self aligned with said edge of said gate in said high voltage LDMOS and in said low voltage LDMOS.

17. The device of claim 16 further including a P+ bulk in contact with said P body and said N+ spacer and self implant with said gate sidewall oxide in said high voltage LDMOS and in said low voltage LDMOS.

18. The device of claim 13 wherein said gate comprises a poly field plate in said high voltage LDMOS.

19. The device of claim 13 wherein said gradient monotonically decreases upward from said first buried well in the top of said first epitaxial layer under said field oxide in said high voltage LDMOS.

20. A method of forming an LDMOS device comprising the steps of:
 a) forming an epitaxial layer on a substrate of a first conductivity type with a buried well in said epitaxial layer of a second conductivity type opposite to said first conductivity type;
 b) forming a field oxide in the top edge of said epi layer in an active area of the high voltage LDMOS device;
 c) making first, second, and third vertical implants into said epi layer, said field oxide shielding said epi layer from said third implant;
 d) forming a P well in a source region and an N well in a drain region; and
 e) forming a source, drain, and gate on a gate oxide with said drain on one side of said field oxide and said gate and source on an opposite side of said field oxide.

21. The method of claim 20 wherein said gate oxide is formed as a stepped gate oxide.

22. The method of claim 20 wherein said source is formed as an N+ source spacer located under a sidewall oxide formed on a side of said gate and which is a self aligned implant with an edge of said gate.

23. The method of claim 22 further including forming a P body which is in contact with said N+ spacer and which is a self aligned implant with said edge of said gate.

24. The method of claim 23 further including forming a P+ bulk in contact with said P body and said N+ spacer and which is a self aligned implant with said gate sidewall oxide.

25. The method of claim 23 wherein said P body is formed by ion implantation at a low tilt angle.

26. The method of claim 22 wherein said N+ source spacer is formed by ion implantation at a low tilt angle.

27. The method of claim 20 wherein said gate is formed with a poly field plate.

28. The method of claim 20 wherein the dopant concentration of the sum of the dopant concentrations of said first and second vertical implants is less than the dopant concentration in said buried well.

29. The method of claim 20 wherein said gradient monotonically decreases upward from said buried well to said field oxide.

30. The method of claim 20 wherein the step of forming an epitaxial layer comprises the steps of:
 a) growing a first epitaxial layer on said substrate;
 b) forming said buried well in an upper portion of said first epitaxial layer; and
 c) growing a second epitaxial layer above said first buried layer.

31. The method of claim 20 wherein said first, second, and third implants are retrograde implants.

32. A method of forming an LDMOS device comprising the steps of
 a) forming an epitaxial layer on a substrate of a first conductivity type with a buried well in said epitaxial layer of a second conductivity type opposite to said first conductivity type;
 b) making first, second, and third vertical implants into said epi layer, said first implant in a portion of said epitaxial layer near said buried layer, said second implant shallower than said first implant, and said third implant shallower than said second implant, said second implant being of a lower dopant concentration than said first and third implants; and c) forming a source, drain, and gate on a gate oxide with said drain on one side of said field oxide and said gate and source on an opposite side of said field oxide.

33. The method of claim 32 wherein said gate oxide is formed as a stepped gate oxide.

34. The method of claim 32 wherein said source is formed as an N+ source spacer located under a sidewall oxide formed on a side of said gate and which is a self aligned implant with an edge of said gate.

35. The method of claim 34 further including forming a P body which is in contact with said N+ spacer and which is a self aligned implant with said edge of said gate.

36. The method of claim 35 further including forming a P+ bulk in contact with said P body and said N+ spacer and which is a self aligned implant with said gate sidewall oxide.

37. The method of claim 35 wherein said P body is formed by ion implantation at a low tilt angle.

38. The method of claim 34 wherein said N+ source spacer is formed by ion implantation at a low tilt angle.

39. The method of claim 32 wherein the dopant concentration of the sum of the dopant concentrations of said first and second vertical implants is less than the dopant concentration in said buried well.

40. The method of claim 32 wherein the step of forming an epitaxial layer comprises the steps of:
a) growing a first epitaxial layer on said substrate;
b) forming said buried well in an upper portion of said first epitaxial layer; and
c) growing a second epitaxial layer above said first buried layer.

41. The method of claim 32 wherein said first, second, and third implants are retrograde implants.

42. A method of forming a high voltage LDMOS and a low voltage LDMOS on a substrate of a first conductivity type comprising the steps of:
a) forming said high voltage LDMOS comprising the steps of:
i) forming a first epitaxial layer on said substrate with a first buried well in said epitaxial layer of a second conductivity type opposite to said first conductivity type and of a first dopant concentration;
ii) forming a field oxide in the top edge of said epi layer in an active area of the high voltage LDMOS;
iii) making first, second, and third vertical implants into said epi layer, said field oxide shielding said epi layer from said third implant;
iv) forming a P well in a source region and an N well in a drain region; and
v) forming a source, drain, and gate each at the same time for both devices with said drain on one side of said field oxide and said gate and source on an opposite side of said field oxide high voltage LDMOS;
b) forming said low voltage LDMOS comprising the steps of:
i) forming an second epitaxial layer on said substrate with a second buried well in said first epitaxial layer of a second conductivity type opposite to said first conductivity type and of a first dopant concentration;
ii) forming a field oxide in the top edge of said epi layer in an active area of the high voltage LDMOS;
iii) making first, second, and third vertical implants into said epi layer, said field oxide shielding said epi layer from said third implant; and
iv) forming a P well in a source region and an N well in a drain region; and
v) forming a source, drain, and gate each at the same time for both devices with said drain on one side of said field oxide and said gate and source on an opposite side of said field oxide high voltage LDMOS.

43. The method of claim 42 wherein said gate oxide is formed as a stepped gate oxide in said high voltage LDMOS and in said low voltage LDMOS.

44. The method of claim 42 wherein said source is formed as an N+ source spacer located under a sidewall oxide formed on a side of said gate and which is self aligned implant with an edge of said gate in said high voltage LDMOS and in said low voltage LDMOS.

45. The method of claim 44 further including forming a P body which is in contact with said N+ spacer and which is self a aligned implant with said edge of said gate in said high voltage LDMOS and in said low voltage LDMOS.

46. The method of claim 45 further including forming a P+ bulk in contact with said P body and said N+ spacer and which is a self aligned implant with said gate sidewall oxide in said high voltage LDMOS and in said low voltage LDMOS.

47. The method of claim 46 further including a P+ bulk, a N+ spacer both built inside a step body consisting with a P body and a P well located said source area in said high voltage LDMOS and in said low voltage LDMOS.

48. The method of claim 45 wherein said P body is formed by ion implantation at a low tilt angle in said high voltage LDMOS and in said low voltage LDMOS.

49. The method of claim 44 wherein said N+ source spacer is formed by ion implantation at a low tilt angle in said high voltage LDMOS and in said low voltage LDMOS.

50. The method of claim 42 wherein said N+ drain, N well, the first, second, and third implants form a graded drain doping profile in said high voltage LDMOS and in said low voltage LDMOS.

51. The method of claim 42 wherein said gate is formed with a poly field plate in said high voltage LDMOS.

52. The method of claim 42 wherein the dopant concentration of the sum of the dopant concentrations of said first and second vertical implants is less than the dopant concentration in said buried well in said high voltage LDMOS and in said low voltage LDMOS.

53. The method of claim 42 wherein said gradient monotonically decreases upward from said buried well to said field oxide in said high voltage.

54. The method of claim 42 wherein the step of forming an epitaxial layer in said high voltage LDMOS and in said low voltage LDMOS comprises the steps of:
a) growing a first epitaxial layer on said substrate;
b) forming said buried well in an upper portion of said first epitaxial layer; and
c) growing a second epitaxial layer above said first buried layer.

55. The method of claim 42 wherein said first, second, and third implants are retrograde implants in said high voltage LDMOS and in said low voltage LDMOS.

56. The method of claim 42 wherein said first and second epitaxial layers are formed at the same time as a single epitaxial layer.

57. The method of claim 42 wherein said first and second buried layers are formed at the same time as a single buried layer.

* * * * *